US006213789B1

(12) United States Patent
Chua et al.

(10) Patent No.: US 6,213,789 B1
(45) Date of Patent: Apr. 10, 2001

(54) METHOD AND APPARATUS FOR INTERCONNECTING DEVICES USING AN ADHESIVE

(75) Inventors: Christopher L. Chua, San Jose; David K. Fork, Los Altos; Patrick G. Kim, Santa Clara; Linda Romano, Sunnyvale, all of CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/461,195

(22) Filed: Dec. 15, 1999

(51) Int. Cl.[7] ............................. H01R 12/00; H05K 1/00
(52) U.S. Cl. ........................ 439/81; 439/74; 439/66; 439/91; 349/149; 349/151; 349/152
(58) Field of Search ............................ 439/31, 74, 66, 439/91; 349/149, 151, 152

(56) References Cited

U.S. PATENT DOCUMENTS

| | | | |
|---|---|---|---|
| 2,562,685 | 7/1951 | Adams | 297/15 |
| 3,356,369 | 12/1967 | Stubbmann . | |
| 3,826,984 | 7/1974 | Epple | 324/158 |
| 3,842,189 | 10/1974 | Southgate | 174/52 |
| 4,320,438 | 3/1982 | Ibrahim et al. | 361/401 |
| 4,423,401 | 12/1983 | Mueller | 337/107 |
| 4,758,927 | 7/1988 | Berg | 361/401 |
| 5,090,118 | 2/1992 | Kwon et al. | 29/843 |
| 5,121,298 | 6/1992 | Sarma et al. | 361/406 |
| 5,142,644 * | 8/1992 | VanSteenkiste et al. | 359/88 |
| 5,152,695 * | 10/1992 | Grabble et al. | 439/71 |
| 5,280,139 | 1/1994 | Suppelsa et al. | 174/260 |
| 5,487,999 | 1/1996 | Farnworth | 437/7 |
| 5,513,430 | 5/1996 | Yanof et al. | 29/846 |
| 5,613,861 * | 3/1997 | Smith et al. | 439/81 |
| 5,665,648 * | 9/1997 | Little | 438/117 |
| 5,944,537 * | 8/1999 | Smith et al. | 439/81 |
| 6,031,590 * | 2/2000 | Kim | 349/86 |

FOREIGN PATENT DOCUMENTS

| | | |
|---|---|---|
| 6-249880 | 9/1994 | (JP) . |
| 76855 | 5/1950 | (NO) . |
| WO 94/09374 | 4/1994 | (WO) . |
| 96/41506 * | 12/1996 | (WO) . |
| WO 96/41506 | 12/1996 | (WO) . |
| WO 99/18445 | 4/1999 | (WO) . |

OTHER PUBLICATIONS

A.E. "Bill" Corwith, "Probing at Die Level", *Advanced Packaging*, Jan./Feb. 1995, p. 26 & 28.

(List continued on next page.)

*Primary Examiner*—Kenneth Parker
*Assistant Examiner*—Mike Qi
(74) *Attorney, Agent, or Firm*—Oliff & Berridge, PLC

(57) ABSTRACT

A method and apparatus for interconnecting at least two devices. Each of the interconnected devices includes a contact structure for electrically and/or physically interconnecting the devices. Preferably, the contact structure for at least one of the devices includes a spring contact. An adhesive, such as a UV-curable adhesive, is applied to at least a portion of one of the devices, and once the adhesive is applied, the devices are assembled, i.e., brought into sufficient proximity so that the contact structures interconnect the devices. The adhesive can be applied directly to contact structures of one of the devices and/or can be applied to other portions of the devices so that the adhesive flows around the contact structures during assembly. The adhesive is then cured to bond the devices together. Applying the adhesive before assembling the devices prevents interference with the interconnection between the contact structures, especially if the contact structures include spring contacts to be electrically connected with corresponding contact pads.

30 Claims, 8 Drawing Sheets

OTHER PUBLICATIONS

IBM Technical Disclosure vol. 34 No. 78, Dec. 1991.

Donald L. Smith et al., "Flip–Chip Bonding On 6–Um Pitch Using Thin–Film Microspring Technology," to be published in *Proc. 48th Electronic Components And Technology Conf.*, May 1998.

Donald L. Smith et al., "A New Flip–Chip Technology for High–Density Packaging," *Proc. 46th Electronic Components and Technology Conf.*, May 1996.

Donald L. Smith et al., "A New, High–Compliance Flip–Chip Technology," *Display Works Conference*, Feb. 1996.

K. Bohringer, "Computational Methods for Design and Control of MEMS Actuator Arrays," Sep. 12, 1997, Abstract from Seminar.

A. Lee, J. Hamilton, J. Trevino, "A Low Power, Tight Seal, Polyimide Electrostatic Microvalve," Micro–Electro–Mechanical Systems ASME, Dynamic Systems and Control Division Publication, v. 56, pp. 345–349, Nov. 17, 1996.

* cited by examiner

METHOD AND APPARATUS FOR INTERCONNECTING DEVICES USING AN ADHESIVE

BACKGROUND OF THE INVENTION

Incorporated Patents

This Application is related to U.S. Pat. Nos. 5,613,861 and 5,944,537, which are hereby incorporated by reference in their entirety. U.S. Pat. Nos. 5,665,648 and 3,842,189 are also hereby incorporated by reference in their entirety.

1. Field of Invention

This invention generally relates to interconnecting devices, such as integrated circuits, circuit boards, electrode arrays, or other devices.

2. Description of Related Art

As described in U.S. Pat. No. 5,613,861, standard bonding techniques for electrically connecting integrated circuits, or chips, to a circuit board or other device include wire bonding, tab bonding, solder-bump and gold-bump flip-chip bonding and other techniques. However, these standard bonding techniques suffer from various problems and limitations, including relatively low resistance to thermal and mechanical shock and being incapable of being made very small, e.g., allowing a contact pad pitch of several microns.

SUMMARY OF THE INVENTION

The invention provides a method and apparatus for interconnecting two devices by using an adhesive that surrounds the contact structures on the devices and adheres to the device substrates. According to the invention, the two devices are interconnected by first applying an adhesive to at least one of the devices. The adhesive can be applied so that the adhesive surrounds at least some of the contact structures on the device or can be applied away from the contact structures. As used herein, the term "contact structure" can include contact pads, spring contact structures or other physical or electrical connection structures, and the term "device" can include any type of apparatus including circuit boards, semiconductor chips, a laser device, an optoelectronics module, etc. After the adhesive is applied, the devices and their corresponding contact structures are aligned and the devices are brought into sufficient proximity to allow the contact structures on the devices to interconnect, e.g., electrically interconnect. As the devices are brought into sufficient proximity, the adhesive can flow into areas where contact structures are present. Thus, even if the adhesive is applied to a device in an area where no contact structure is present, adhesive can flow around the contact structures during assembly. The adhesive is cured or otherwise hardened to bond the devices together.

The inventors have discovered that if an adhesive is applied, e.g., injected in a conventional fashion, between devices after the devices are electrically connected, the adhesive can disrupt the connection between the devices, especially if delicate spring contacts are used to interconnect the devices. Thus, the adhesive is applied to at least one of the devices before the devices are assembled.

In one aspect of the invention, the contact structure of at least one of the interconnected devices includes at least one spring contact.

In one aspect of the invention, a spring contact that is part of a device's contact structure includes a stress gradient formed in the spring contact, which causes the spring contact to bend away from the substrate and thus provide compliant contact with a corresponding contact pad.

In one aspect of the invention, spring contacts included in a contact structure of a first device are formed of a thin metal strip which is in part fixed to a substrate and electrically connected to a via on the substrate. The free portion of the metal strip not fixed to the substrate bends up and away from the substrate. When a contact pad on a second device is brought into pressing contact with the free portion of the metal strip, the free portion deforms and provides compliant contact with the contact pad. Since the metal strip is electrically conductive or coated with a conductive material, the via on the substrate is electrically connected to the contact pad on the second device via the spring contact.

In one aspect of the invention, spring contacts can have various tip configurations, including a single point, multiple points, a deformable tab, a flat end, etc.

In one aspect of the invention, spring contacts can have various configurations such that portions other than a tip of spring contact are connected to a corresponding contact pad. For example, a spring contact can curl to form an arc of 180 degrees or more.

In one aspect of the invention, the contact structures of the devices can include various connection devices.

In one aspect of the invention, at least one of the interconnected devices can be or include an LED device, a laser emitting device or devices, a photodetector, microelectronics devices, an LCD device, a driver device, etc.

Other aspects of the invention will be apparent and/or obvious from the following description.

BRIEF DESCRIPTION OF THE DRAWINGS

The invention is described in relation to the following drawings, in which reference numerals refer to like elements and wherein.

DETAILED DESCRIPTION OF PREFERRED EMBODIMENTS

The invention is described below as interconnecting two different devices by applying an adhesive to at least one of the devices, aligning the contact structures of the two devices, bringing the devices into sufficient proximity (i.e., to allow the contact structures to interconnect) and curing or otherwise hardening the adhesive. The contact structures on the devices can include any type of interconnect structure, such as electrical interconnect structures like contact pads and corresponding solder bumps. However, the invention is described below in connection with using spring contacts as part of the contact structure of at least one of the interconnected devices. Accordingly, a brief description of a spring contact and how a spring contact can be made, as is fully described in U.S. Pat. Nos. 5,613,861 and 5,944,537, is provided before describing the device interconnect invention. It should be appreciated that the following description is only one example. Thus, the spring contacts can be made in any desired way, such as that described in U.S. Pat. Nos. 5,665,648 and 3,842,189, for example.

Figure 1:
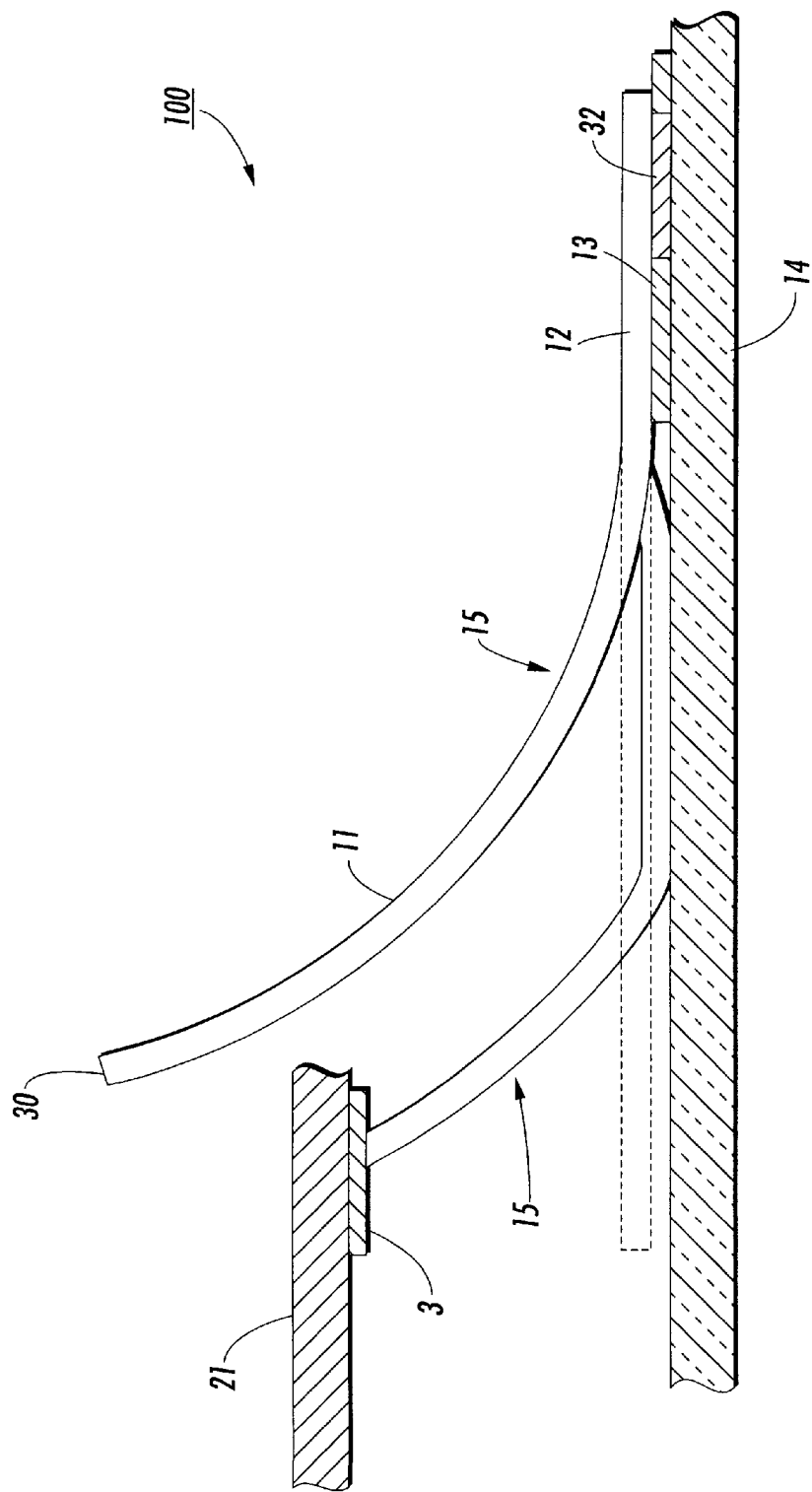
FIG. 1 is a spring contact in an undeformed free state and another spring contact deformed when contacting a contact pad.

FIG. 1 shows a side view of an interconnected device structure 100 including a first device 14 that is connected to a second device 21. The first device 14 has a contact structure that includes a plurality of spring contacts 15 (although only one spring contact 15 is shown). Each spring contact 15 comprises a free portion 11 and an anchor portion 12 fixed to a release layer 13 and electrically connected to a via 32. Each spring contact 15 is made of an extremely elastic material, such as a chrome-molybdenum alloy or a nickel-zirconium alloy. Preferably, the spring contacts 15 are formed of an elastic conductive material, although they can be formed of a non-conductive or semi-conductive material if they are coated or plated with a conductor material (assuming the devices 14 and 21 are to be electrically interconnected). More preferably, the spring contacts 15 are formed of a nickel-zirconium alloy having 1% zirconium, a chrome-molybdenum alloy (20% Cr-80% Mo), a tungsten (W)-based alloy, or a chromium (Cr) based alloy. Zirconium is added to the nickel in the nickel-zirconium alloy to improve the elastic properties of the alloy while not greatly reducing the conductivity of the nickel. When the elastic material is not conductive, it is coated on at least one side with a conductive material, such as a metal or metal alloy.

The via 32 and the contact pad 3 on the first and second devices 14 and 21 can be the terminal ends of a communication line that electrically communicates with an electronic device formed on the first and second devices 14 and 21, such as a transistor, a display electrode, or other electrical device, or can communicate with other contact structures such as wirebond pads, solder bumps, etc. The via 32 and the contact pad 3 are typically made of aluminum, but can be made of any conductive material. If the contact pad 3 is made of aluminum, the contact pad 3 is preferably coated with a conductive and preferably inert material, such as gold, gold alloys, indium tin oxide, nickel, palladium, platinum, rhodium, etc. This allows the spring contact 15 to make better electrical contact with the contact pad 3, since the spring contact 15 is not required to "scrub" the uncoated contact pad 3 to break through the aluminum oxide that forms on an uncoated aluminum contact pad 3. Preferably, a thin coating of Titanium (Ti) is applied to the uncoated aluminum contact pad 3 to promote good adhesion of the gold to the contact pad 3.

The release layer 13 is made of silicon nitride or other etchable material, and can be electrically insulating or conducting. However, the release layer 13 is not necessary and can be eliminated. The release layer 13 and the via 32 are formed on or over a first device 14, which can have a substrate formed of an insulating material, such as oxidized silicon or glass.

The spring contacts 15 on the device 14 can be formed as follows. A via 32 is formed on or over a substrate in the first device 14. Additionally, a release layer 13 can be formed on or over the first device 14. However, as mentioned above, the release layer 13 is not required and can be eliminated.

A layer of metal is then deposited on or over a portion of the first device 14. In a preferred embodiment, the metal is the nickel-zirconium alloy described above. Part of the metal layer is electrically connected to or directly contacts the via 32 and another portion of the metal layer is deposited on or over the release layer 13, if present. There are many methods available for depositing a metal layer on or over the first device 14, including electron-beam deposition, thermal evaporation, chemical vapor deposition, sputter deposition and other methods. Preferably, the metal layer is sputter deposited.

When sputter-depositing a metal, a plate of the metal, called the target, is placed on a cathode, which is set to a high negative potential and immersed in a low-pressure, typically 1 to 100 millitorr, gas. This causes a glow-discharge plasma to ignite, from which positive ions are accelerated into the negatively charged target. This ion bombardment knocks metal atoms off the target, and many of these deposit on nearby surfaces, such as on the first device 14.

The metal layer can be thought of as deposited in several sub-layers to a final thickness of any desired thickness, e.g., approximately 1 $\mu$m. A stress gradient is introduced into the metal layer by altering the stress inherent in each of the sub-layers of the metal layer so that each sub-layer has a different level of inherent stress.

Different stress levels can be introduced into each sub-layer of the deposited metal layer during sputter deposition in a variety of ways, including adding a reactive gas to the plasma, depositing the metal at an angle, and changing the pressure of the plasma gas. Preferably, the different levels of stress are introduced into the metal layer by varying the pressure of the plasma gas, which is preferably argon. The pressure of the plasma gas can be varied in a stepwise fashion, or continuously, as desired.

To form the spring contact 15 shown in FIG. 1, the metal layer is formed so that a sub-layer near the device 14 substrate has a compressive stress and upper layers have increasingly tensile stress toward the top of the metal layer. Although the stress gradient in the metal layer biases the layer to bend into an arc, the metal layer adheres to the release layer 13, the first device 14, and the contact pad 3, and thus lies flat.

After the metal layer is deposited, the metal layer is photolithographically patterned into the spring contacts 15. Photolithographic patterning is a well-known technique and is routinely used in the semiconductor chip industry and allows the spring contacts to be formed in almost any shape or configuration.

Next, the free portion 11 of the spring contact 15 is released from the release layer 13, preferably by a process of under-cut etching, i.e., removing at least a portion of the release layer 13 or other substrate under the free portion 11. Thus, the spring contacts 15 are released from the release layer 13 and are allowed to bend up and away from the release layer 13 due to the stress gradient in the spring contacts 15.

Only those areas of the release layer 13 under the free portion 11 of the spring contact 15 are under-cut etched. Thus, the anchor portion 12 of the spring contact 15 remains fixed to the release layer 13 and does not pull away from the release layer 13.

When the contact pad 3 on the device 21 is aligned with the tip of the spring contact 15 and the first and second devices 14 and 21 are moved toward each other, the spring contact 15 contacts the pad 3 and elastically deforms. Therefore, the tip 30 of the spring contact 15 is compliantly forced into the contact pad 3 to establish an electrical contact between the contact pads 3.

A layer of gold or other resistance lowering material such as copper, nickel, palladium, etc., can be formed over the outer surface of each spring contact 15 to reduce the resistance in the spring contacts 15, but can be replaced with any other resistance lowering material.

Since the process for forming the spring contacts 15 is limited only by the design rules of photolithographic patterning, many hundreds or thousands of spring contacts 15 can be formed closely together in a relatively small area on the first device 14. The typical width w of the spring contact 15 can be 10–100 µm. Therefore, the spring contacts 15 can be formed close together, at a spacing of approximately 10–20 µm, and less if necessary. This makes the center-to-center distance between adjacent spring contacts 15 approximately 20–120 µm, which is within or less than the typical center-to-center distance between adjacent contact pads 3 on a standard semiconductor chip.

Figure 2:
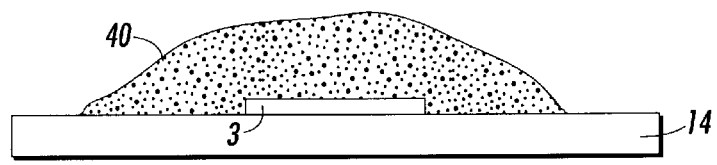
FIGS. 2–4 show steps in a method of interconnecting two devices in accordance with the invention.
Figure 3:
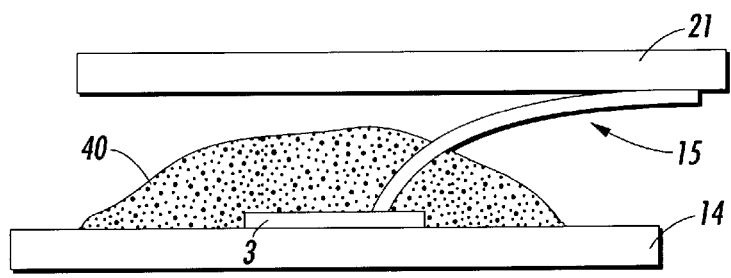
Figure 4:
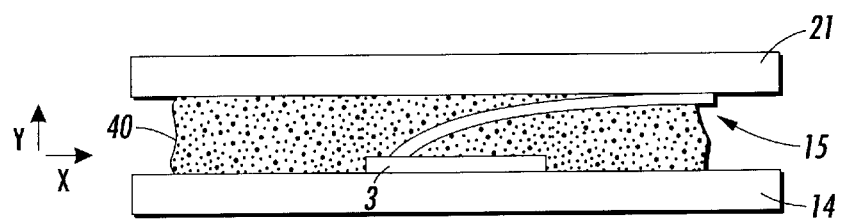

FIGS. 2–4 show steps in a method for interconnecting two devices in accordance with the invention. In FIG. 2, a first device 14 is provided that has a contact structure including at least a contact pad 3. The contact structure can of course include other interconnect structures including spring contacts, solder bumps, alignment structures that ensure alignment between interconnected devices, spacing structures that ensure proper spacing between interconnected devices, etc. Next, an adhesive 40, or molding compound, is applied to the first device 14. The adhesive 40 can be applied to portions of the first device 14 that include contact structures and/or to portions of the first device 14 that do not include contact structures. FIG. 2 shows an example where adhesive 40 is applied over a contact structure on the first device 14.

The adhesive 40 can be a UV-curable optically transparent adhesive, such as Loctite 352, but other compounds, such as other UV-curable adhesives, thermal setting compounds, multi-component adhesives such as a two-part epoxy, or other compounds can be used. Preferably, the adhesive 40, or molding compound, is electrically insulating, but semiconductive, anisotropically conductive or conductive compounds could be used if desired. For example, an adhesive 40 that is only electrically conductive along an applied electric field, but otherwise insulating, could be used to interconnect contact pads 3 on the first and second devices 14 and 21 without requiring the contact pads 3 to physically touch.

The adhesive 40 can be applied to the first device 14 in various different ways, including using a micro-actuated applicator. When using a micro-actuated applicator, a wire is dipped into a pool of viscous adhesive solution. When the wire is lifted from the pool, an amount of adhesive 40 is carried by the wire, and the adhesive 40 can be applied by lowering the wire to the desired portions of the first device 14. Of course, the adhesive 40 can also be applied to the second device 21, if desired. The adhesive 40 can also be applied in other ways, including spraying, injecting, etc.

As shown in FIG. 3, the contact structures of the first and second devices 14 and 21 are next aligned with each other. That is, the contact structures, e.g., spring contacts, contact pads, etc., on the first and second devices 14 and 21 are aligned with each other so that when the first and second devices 14 and 21 are moved into sufficient proximity with each other, as shown in FIG. 4, the contact structures interconnect the devices 14 and 21. The interconnection can be electrical interconnection and/or physical interconnection.

The process of bringing the first and second devices 14 and 21 into sufficient proximity can involve steps other than simply moving the devices 14 and 21 together. For example, the first and second devices 14 and 21 and or elements in the respective contact structures can be moved laterally relative to each other to scrub the spring contacts 15 into the corresponding contact pads 3. As the first and second devices 14 and 21 are moved together, excess adhesive 40 is squeezed out and a thin layer of adhesive 40 is trapped between the devices 14 and 21 to encapsulate the entire package. When the first and second devices 14 and 21 are moved to a final relative position, the adhesive 40 is cured or otherwise hardened to bond the devices 14 and 21 as well as their contact structures together.

Although only two devices 14 and 21 are shown, of course three or more devices can be bonded together according to the invention. Further, the devices can be or include any type of apparatus such as a circuit board or other electrical interconnection device, a laser emitting element, a light modulating element, a light detecting element, a vertical cavity surface emitting laser, a light emitting diode, an edge emitting laser, a switching element, a controller, a data processing apparatus, a semiconductor chip, a semiconductor memory or logic chip, an optoelectronics module, and a micro-electro-mechanical device.

The inventors have discovered that when at least one of the devices 14 and 21 includes spring contacts 15 as part of its contact structure, the devices 14 and 21 should be interconnected by first applying adhesive to at least one of the devices 14 and 21 and then assembling the devices 14 and 21 into a final package, especially when the spring contacts 15 are very thin, e.g., 5–20 microns. That is, the inventors have found that the interconnection between contact structures of the devices 14 and 21 can be disrupted if the adhesive 40 is injected between the devices in a conventional fashion after the contact structures are interconnected, e.g., injecting adhesive 40 after somewhat delicate spring contacts 15 and corresponding contact pads 3 are electrically connected. The electrical interconnect between the spring contacts 15 and the contact pads 3 is disrupted by the surface tension of the adhesive 40 as it flows between the devices 14 and 21, and some of the adhesive 40 forces itself between the spring contacts 15 and their corresponding contact pads 3. Accordingly, applying the adhesive 40 to at least one of the devices 14 and 21 before the devices 14 and 21 are moved together and the contact structures interconnected can be critical to proper assembly of two devices having spring contacts 15 as part of a contact structure.

Applying the adhesive 40 to one of the devices 14 and 21 before assembly also has the benefit of reducing the likelihood of void formation in the adhesive 40 since pressure is applied to the adhesive 40 when the devices 14 and 21 are moved together and the adhesive 40 is squeezed out from between the devices 14 and 21. Interconnecting the devices 14 and 21 according to the invention also has the benefit of shorter assembly time since adhesive 40 can be forced out from between the devices 14 and 21 more quickly than adhesive 40 can be injected or wicked into the space between devices 14 and 21 after the devices 14 and 21 have been brought together.

The adhesive 40 can also provide a sealing function against atmospheric contaminants and, if properly selected, the adhesive 40 does not contribute contaminants of its own. When the adhesive 40 is cured, the adhesive 40 can undergo a slight contraction, e.g., up to 4%, which increases the compressive force of the spring contact 15 into the contact pad 3. This compression is caused by shrinkage of the adhesive 40 in the y direction, as shown in FIG. 4. The adhesive 40 shrinks in the y direction rather than the x direction because when the adhesive 40 is bonded to the first device 14 and the second device 21, the first device 14 and the second device 21 resist shrinkage of the adhesive 40 in the x direction. The additional compressive force provided between the spring contact 15 and the contact pad 3 will remain over a relatively wide temperature range, providing of course that the differential thermal expansion of the adhesive 40 relative to the contacts does not exceed the initial contraction value of, for example, 4%. The adhesive 40 can also perform a heat sink function to remove heat from elements of the devices 14 and 21.

Figure 5:
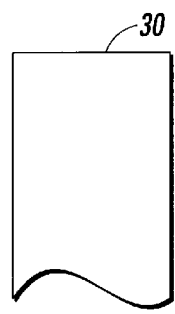
FIGS. 5–10 show a plurality of types of spring contact tips.
Figure 6:
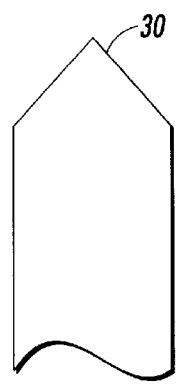
Figure 7:
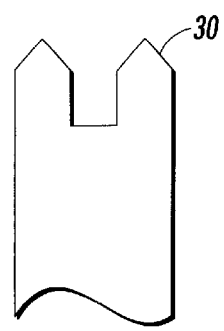
Figure 8:
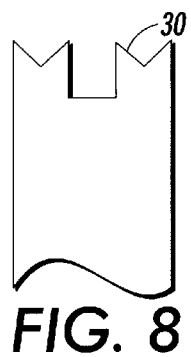
Figure 9:
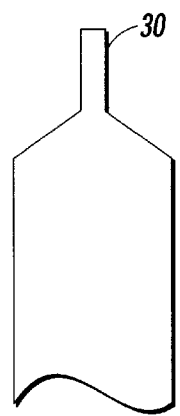
Figure 10:
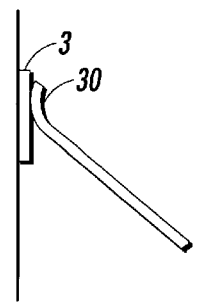

FIGS. 5–10 show various tip 30 configurations for spring contacts 15 used with the invention. The shape of the spring contact tip 30 can take different forms, depending on the application. Since the spring contacts 15 are photolithographically patterned, the spring contact tips 30 are easily formed in a variety of shapes. FIG. 5 shows a spring contact tip 30 having a flat end. The spring contact tip 30 shown in FIG. 6 has a pointed end which concentrates the force exerted by the spring contact 15 at a single point on the contact pad 3. This pointed shape aids the spring contact tip 30 when breaking through native oxides which may be present on the contact pads 3. FIGS. 7 and 8 show spring contact tips 30 having multiple points for applications where contact redundancy is required. FIG. 9 shows a spring contact tip 30 having a deformable tab. The deformable tab increases the contact area with the contact pad 3 by deforming as shown in FIG. 10 when the spring contact 15 forces the tip 30 against the contact pad 3. For example, when contacting a gold spring contact tip 30 to a gold contact pad 3, a tip 30 having a flat or deformable end has been found to reduce resistance at the point of contact.

Figure 11:
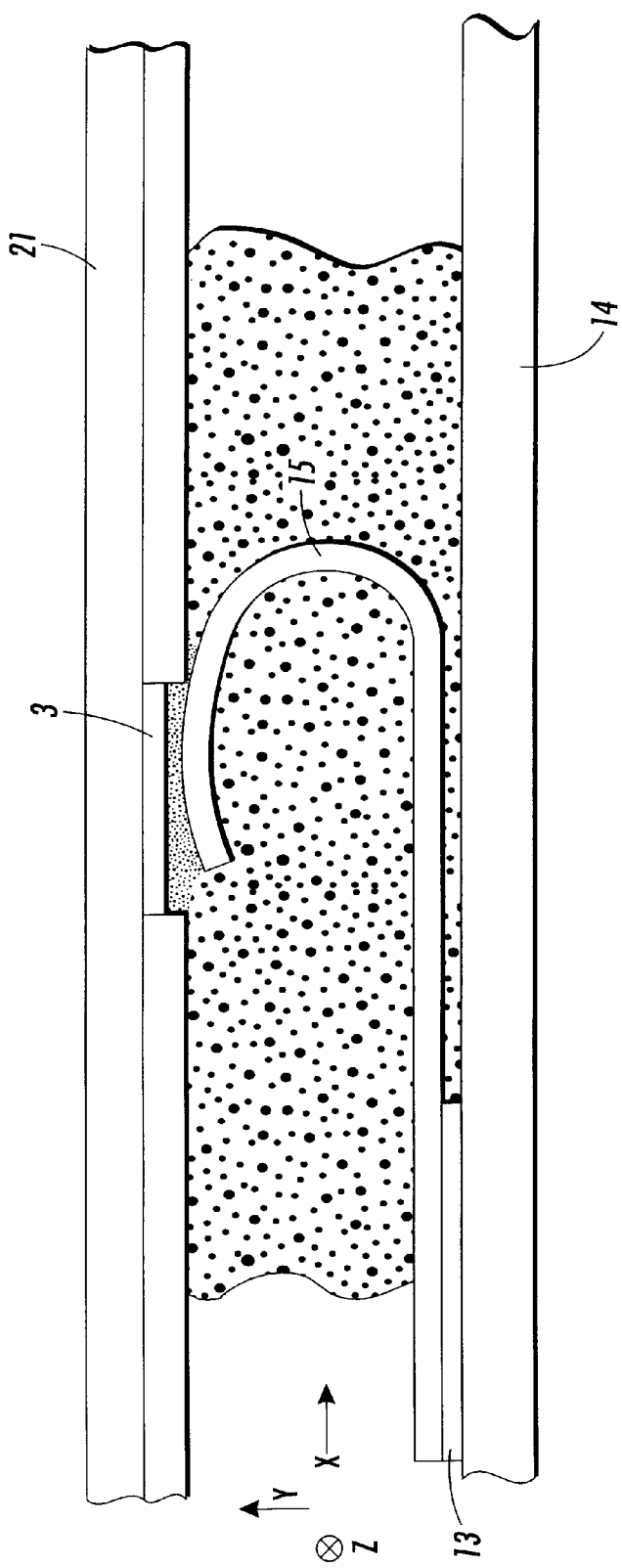
FIG. 11 shows an alternate contact structure for interconnecting two devices.

FIG. 11 shows an alternate type of spring contact that can be used with the invention. In this example, the spring contact 15 is formed so that when it is released from the surface of the first device 14, the free end of the spring contact 15 curls back to form an arc of 180 degrees or more. This arrangement can be advantageous when a large contact area is needed between the spring contact 15 and the contact pad 3, or when relative movement between the second device 21 and the first device 14 in the x direction might stress the spring contact 15/contact pad 3 joint. Relative movement in the x direction is compensated for by flexure in the curved portion of the spring contact 15 between the contact pad 3 and the first device 14.

Figure 12:
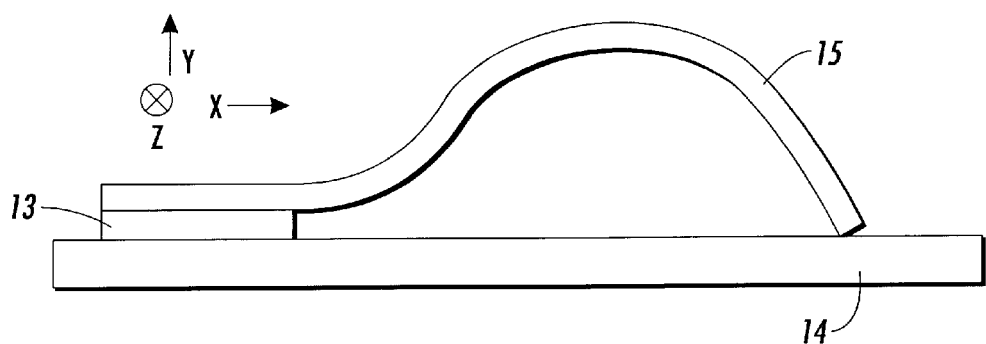
FIGS. 12 and 13 show inverted "shepherd's hook"-type spring contacts.
Figure 13:
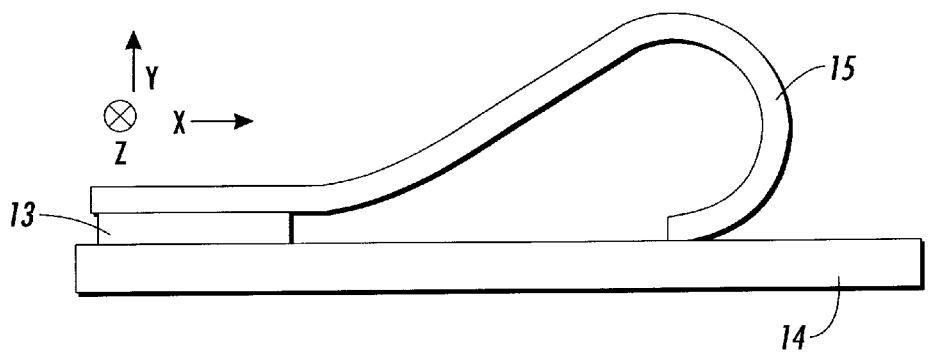

Other possible spring contact 15 configurations include that shown in FIGS. 12 and 13. In these examples, the bottom-most portion of the spring contacts 15 have a tensile stress, while upper portions have decreasing levels of tensile stress and/or increasing levels of compressive stress. Therefore, when the free portion 11 of the spring contact 15 is released from the first device 14, the free portion 11 bends so that the spring contact 15 moves up and away from the first device 14. These configurations have an advantage over other configurations where the free portion 11 does not contact the first device 14 after the free portion 11 is released, e.g., FIG. 1, in that the free portion 11 tends not to move too freely in the z direction shown in FIGS. 12 and 13. This can be an advantage in fine-pitch contact applications where the spring contacts 15 are spaced closely together, e.g., less than 10 $\mu$m apart, and can become entangled with each other.

Figure 14:
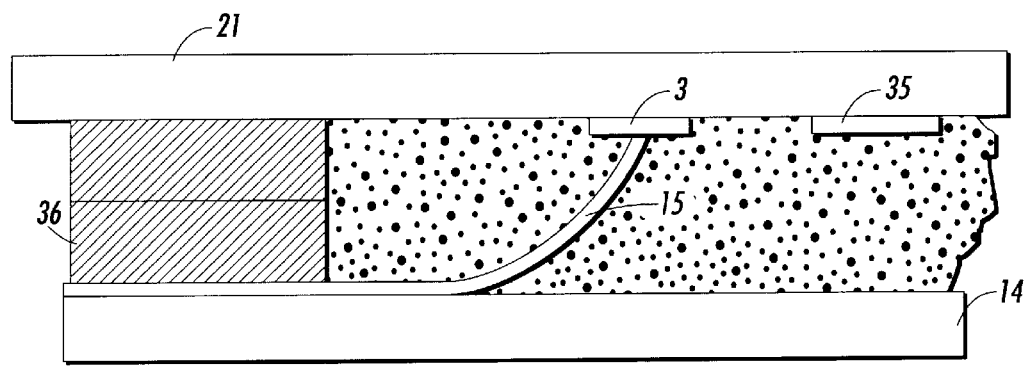
FIG. 14 shows an alternate contact structure for interconnecting two devices.

FIG. 14 shows another configuration of two interconnected devices 14 and 21 where the contact structures, or one of the contact structures, of the devices 14 and 21 include an aligning or spacing structure 36. The structure 36 can, for example, have aligning grooves or bumps that interlock when the devices 14 and 21 are moved together, thus ensuring that the contact structures of the devices 14 and 21 are properly aligned. The structure 36 can also ensure that the devices 14 and 21 are properly spaced apart, e.g., when the device 14 is an LCD panel backplane and the device 21 is an LCD panel front plane. The structure 36 can also function to contain the adhesive 40 and/or prevent the adhesive 40 from contacting certain portions of the contacting structures, e.g., particularly sensitive or fine structures.

As also shown in FIG. 14, the first and second devices 14 and 21 can include any type of elements, such as switching elements (transistors), data processing elements, light emitting elements, etc. Thus, the element 35 can be an LED or laser emitter and can communicate through the spring contact 15 to a driver on the first device 14 that controls the element 35 to selectively emit light. In this example, the adhesive 40 and the substrate of the first device 14 can be transparent so that the element 35 can emit light through the adhesive 40 and the device 14 substrate while being protected from a harmful environment.

Figure 15:
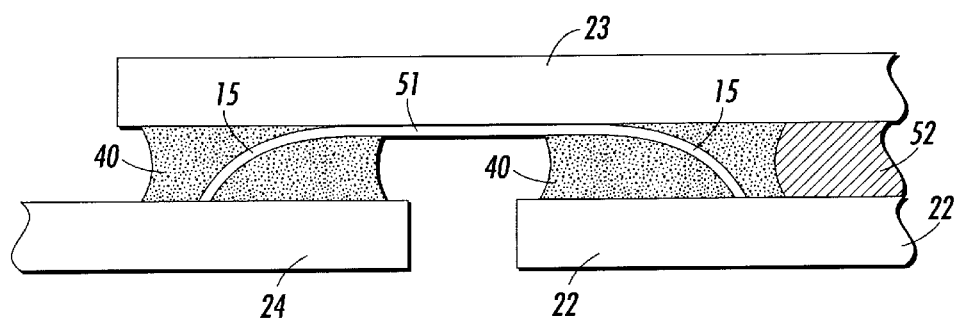
FIG. 15 shows an exemplary device interconnection structure for a liquid crystal displays.

As discussed above, the devices 14 and 21 can be any desired set of devices that are interconnected, including, a circuit board, a semiconductor chip, a probe card, or other electronic devices. FIG. 15 shows one detailed example of how three devices in a liquid crystal display (LCD) can be interconnected using the invention. In this example, an active matrix backplane 22 for the LCD and an off-display board 24, such as a device driver, are interconnected with an LCD front plane 23. The contact structure of the active matrix backplane 22 and the off-display board 24 can include contact pads 3, spring contacts 15, metal traces, wirebond pads, bumps, tabs, etc. The contact structure of the LCD front plane 23 can include metal traces (including indium-tin oxide (ITO) traces), spring contacts 15, contact pads 3, wirebond pads, bumps, tabs, etc. In the cross section shown in FIG. 15, the front plane 23 includes spring contacts 15 that connect with contact pads 3, traces or other structures (not shown) on the active matrix backplane 22 and the off-display board 24. A conductive trace 51 or other structure electrically connects the two spring contacts 15 shown so that appropriate elements in the active matrix backplane 22 and the off-display board 24 can communicate.

As described above, adhesive 40 is applied to the active matrix backplane 22, the LCD front plane and/or the off-display board 24. After application of the adhesive, the backplane 22, the front plane 23 and the off-display board 24 are aligned and moved into sufficient proximity so that the respective contact structures interconnect. The adhesive 40 is then cured or otherwise hardened to bond the devices 22, 23 and 24 together. Once the adhesive 40 is cured, a liquid crystal material 52 can be provided between the backplane 22 and the front plane 23 in a conventional fashion. Thus, the adhesive 40, typically an epoxy, can function to both bond the devices 22, 23 and 24 together in accordance with the invention as well as provide a sealing function for the liquid crystal material 52. The spring contacts 15 can also be arranged so that the spring contact tips 30 extend from the adhesive 40 into the liquid crystal material 52 to contact a structure on the backplane 22.

Although the devices 22, 23 and 24 are described as a backplane, front plane and off-display board, the devices 22, 23 and 24 could be replaced with other devices such as a laser emitting or laser array device for the device 22, an electronic device, such as an array of transistors and/or other switching elements for the device 23 and a photodetector or array of photodetectors for the device 24. Such an arrangement could be used, for example, as a scanning device.

Figure 16:
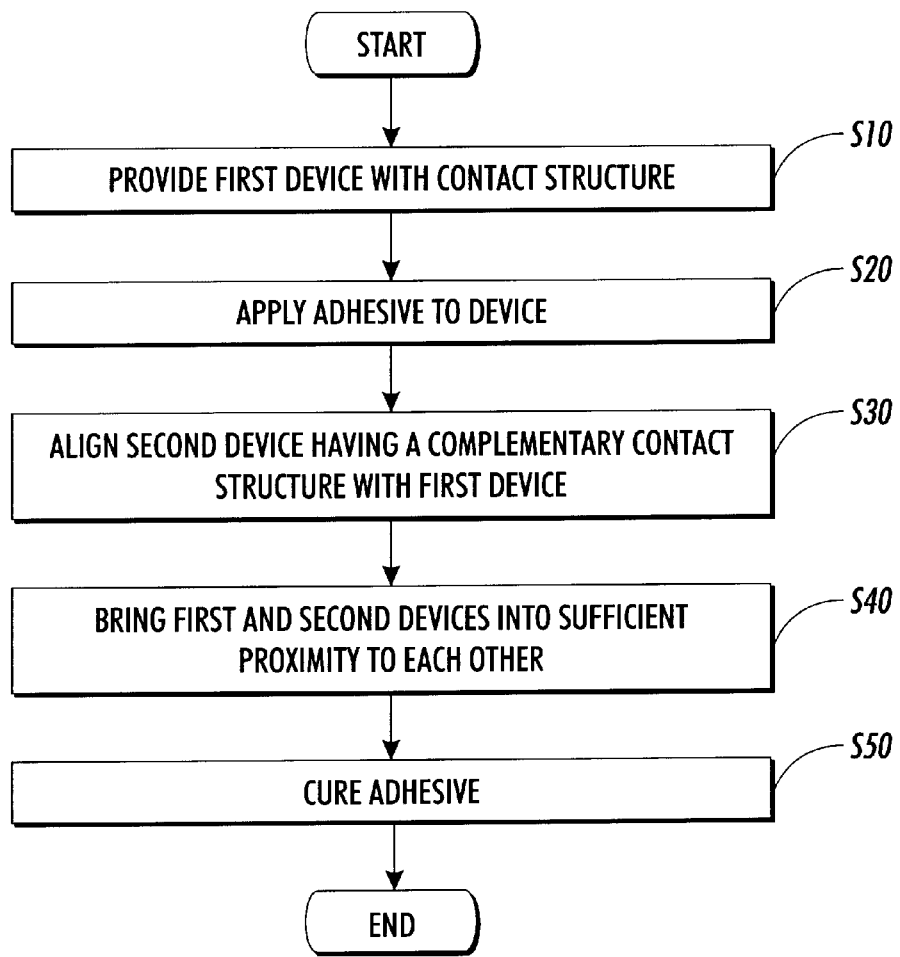
FIG. 16 shows steps of a method of interconnecting two devices.

FIG. 16 shows steps of a method for interconnecting two devices. In step S10, a first device is provided having a contact structure. The first device can include a single device or a group of devices that perform any desired function, such as a display driver, data processor, display, electrical interconnect, heat sink, light or other radiation emitter, detector or modulator, data storage, interface, etc. The contact structure associated with the first device can include any desired physical or electrical interconnect structure, such as contact pads, spring contacts, metal traces, wirebond pads, bumps, tabs, spacers, alignment features, etc. Preferably, the contact structure includes spring contacts for electrical interconnection with a corresponding contact pad.

In step S20, an adhesive is applied to either the first or second device. The adhesive can be applied to the contact structure or portions of the contact structure of either of the devices and/or to portions of the device that include no contact structure. The adhesive can be any kind of compound having various different mechanical and/or electrical properties. The adhesive can be a UV-curable optically transparent adhesive, such as Loctite 352, but other compounds, such as other UV-curable adhesives, thermal setting compounds, multi-component adhesives such as two-part epoxy or other compounds can be used. Preferably, the adhesive is electrically insulating, but semiconductive, anisotropically conductive or conductive compounds could be used if desired. For example, an adhesive that is only electrically conductive along an applied electric field, but otherwise insulating, could be used to interconnect contact pads on the first and second devices without requiring the contact pads to physically touch.

The adhesive can be applied to the devices in various different ways, including using a micro-actuated applicator. When using a micro-actuated applicator, a wire is dipped into a pool of viscous adhesive solution. When the wire is lifted from the pool, an amount of adhesive is carried by the wire, and the adhesive can be applied by lowering the wire to the desired portions of the first device.

In step S30, the second device having a complementary contact structure to the first device is aligned with the first device. As with the first device, the second device can be a single device or a group of devices that perform any desired function. The second device can also have a contact structure including any of the elements mentioned above.

In step S40, the first and second devices are brought into sufficient proximity to each other, preferably so that the contact structures interconnect either physically and/or electrically. Bringing the devices into sufficient proximity also can cause adhesive to flow in the space between the devices and preferably allows the adhesive to surround at least some of the contact structures of the first and second devices. This adhesive flow can prevent voids from forming in the adhesive and ensure the contact structures on the devices are surrounded by adhesive.

In step S50, the adhesive is cured or otherwise hardened, e.g., by exposing the adhesive to UV radiation. Of course, other methods for hardening or setting the adhesive can be used depending on the type of adhesive.

While the invention has been described with reference to specific embodiments, the description of the specific embodiments is illustrative only and is not to be construed as limiting the scope of the invention. Various other modifications and changes may occur to those skilled in the art without departing from the spirit and scope of the invention as set forth in the following claims.

What is claimed is:

1. A method for electrically interconnecting two devices, the method comprising:
    providing a first device having a first electrical contact structure that includes at least one conductive spring contact;
    providing a second device having at least one second electrical contact structure;
    applying an adhesive to at least one of the first and second device;
    aligning the first and second devices;
    bringing the first and second devices into sufficient proximity such that each of at least some of the at least one conductive spring contact extends through the adhesive and contacts a corresponding one of the at least one second electrical contact structure to form an electrical path between each such conductive spring contact and a corresponding second electrical contact structure; and
    curing the adhesive such that the adhesive bonds each of such at least one spring contact to the corresponding electrical second structure.

2. The method of claim 1, wherein both of the first and second contact structures include a spring contact.

3. The method of claim 1, wherein at least one of the first and second contact structures includes a spring contact that is formed by fixing an elastic material having an inherent stress gradient to a substrate and releasing a portion of the elastic material so that the released portion is biased away from the substrate by the inherent stress gradient.

4. The method of claim 1, wherein at least one of the first and second contact structures includes at least one of a contact pad, a gold contact pad, a contact pad having a conductive and inert material coating, a spring contact, a gold spring contact, a metal trace, a wirebond pad, a solder bump, a electrical interconnection tab, a spacer, and a device alignment feature.

5. The method of claim 1, wherein the first and second contact structures include complementary electrical interconnect contact structures so that when the first and second devices are brought into sufficient proximity, the first and second devices are electrically interconnected.

6. The method of claim 1, wherein at least one of the first and second devices includes at least one of a circuit board, an electrical interconnection device, a laser emitting element, a light modulating element, a light detecting element, a vertical cavity surface emitting laser, a light emitting diode, an edge emitting laser, a switching element, a controller, a data processing apparatus, a semiconductor chip, a semiconductor memory or logic chip, an optoelectronics module, and a micro-electro-mechanical device.

7. The method of claim 1, wherein applying the adhesive comprises applying an ultraviolet (UV) curable adhesive, a multi-component adhesive or a thermal setting compound.

8. The method of claim 1, wherein applying the adhesive comprises applying the adhesive to a portion of the first or second contact structure.

9. The method of claim 1, wherein applying the adhesive comprises applying an insulating, conductive, semiconductive or anisotropically conductive compound.

10. The method of claim 1, wherein aligning the first and second devices comprises aligning complementary contact structures on the first and second devices in preparation for electrically contacting the complementary contact structures.

11. The method of claim 1, wherein bringing the first and second devices comprises moving the first and second devices toward each other along a straight line.

12. The method of claim 1, wherein bringing the first and second devices comprises moving the first and second devices toward each other along a straight line and in a direction perpendicular to the straight line to ensure that the contact structures are properly interconnected.

13. The method of claim 1, wherein bringing the first and second devices comprises moving the first and second devices toward each other until the first and second contact structures are properly physically and electrically interconnected.

14. An apparatus formed by the method of claim 1.

15. An apparatus formed by the method of claim 1, wherein at least one contact pad on one device is mechanically scrubbed by a corresponding spring contact tip.

16. An apparatus formed by the method of claim 3.

17. An apparatus formed by the method of claim 4.

18. An apparatus formed by the method of claim 5.

19. An apparatus formed by the method of claim 6.

20. A liquid crystal display formed by the method of claim 1, wherein the first device is an active matrix backplane, and the second device is a display front plane.

21. The liquid crystal display of claim 20, further comprising an off-display board interconnected with the display front plane.

22. The method of claim 1, wherein the first device is an electronic switching device comprising at least one transistor switching element and the second device is a laser array device.

23. The method of claim 1, further comprising interconnecting a photodetector device with the electronic switching device by the method of claim 1.

24. An apparatus including two interconnected devices, comprising:

a first device having a first electrical contact structure that includes at least one conductive spring contact;

a second device having at least one second electrical contact structure, wherein at least one of the at least one conductive spring contact of the first device is electrically interconnected with a corresponding one of at least one second electrical contact structure of the second device; and a pliable adhesive that surrounds at least a portion of each of some of the at least one conductive spring contact that is electrically interconnected with the corresponding second electrical contact structure and bonds the first and second devices together, wherein the pliable adhesive allows accommodation of physical movement of the first and second devices relative to each other while acting to maintain each such conductive spring contact and corresponding second electrical contact structure electrically interconnected.

25. A liquid crystal display apparatus comprising:

an active matrix backplane having at least one first electrical contact structure;

a display frontplane having at least one second electrical contact structure interconnected with the first electrical contact structure; and an adhesive through which at least some of the at least one first electrical contact structure extends and contacts a corresponding one of the at least one second electrical contact structure and bonds the front plane and the backplane together, and the adhesive forms a surface that contains a liquid crystal material between the frontplane and the backplane.

26. The apparatus of claim 25, wherein:

at least one of the first contact structure and the second contact structure includes a spring contact.

27. The apparatus of claim 26, wherein:

at least one spring contact extends from the adhesive into the liquid crystal material to contact a corresponding contact pad.

28. The method of claim 1, wherein applying the adhesive is performed before bringing the first and second devices into the sufficient proximity.

29. The method of claim 1, wherein the adhesive surrounds at least a portion of at least some of the at least one conductive spring contact and some of the at least one second electrical contact structure.

30. A method for electrically interconnecting two devices, the method comprising:

providing a first device having a first electrical contact structure that includes at least one conductive spring contact;

providing a second device having at least one second electrical contact structure;

applying an adhesive to at least one of the first and second device;

aligning the first and second devices;

bringing the first and second devices into sufficient proximity, such that each of at least some of the at least one electrical spring contact contacts a corresponding one of the at least one second electrical contact structure and the adhesive surrounds at least a portion of each such conductive spring contact and the corresponding second electrical contact structure; and curing the adhesive such that the adhesive bonds each such conductive spring contact to the corresponding second electrical contact structure.

* * * * *

UNITED STATES PATENT AND TRADEMARK OFFICE
CERTIFICATE OF CORRECTION

| | | |
|---|---|---|
| PATENT NO. | : 6,213,789 B1 | Page 1 of 1 |
| APPLICATION NO. | : 09/461195 | |
| DATED | : April 10, 2001 | |
| INVENTOR(S) | : Christopher L. Chua et al. | |

It is certified that error appears in the above-identified patent and that said Letters Patent is hereby corrected as shown below:

Column 1, line 12, insert as a new paragraph:

This invention was made with Government support under 70NANB8H4008 awarded by NIST. The Government has certain rights in this invention.

Signed and Sealed this

Seventeenth Day of April, 2007

JON W. DUDAS
*Director of the United States Patent and Trademark Office*